United States Patent [19]
Yamamoto et al.

[11] Patent Number: 6,121,858
[45] Date of Patent: *Sep. 19, 2000

[54] PIEZOELECTRIC LADDER FILTER WITH SERIES RESONATORS HAVING A PAIR OF GROOVES AND METHOD OF FORMING SAME

[75] Inventors: Takashi Yamamoto, Ishikawa-ken; Hirofumi Funaki, Toyama-ken, both of Japan

[73] Assignee: Murata Manufacturing Co., Ltd., Japan

[*] Notice: This patent is subject to a terminal disclaimer.

[21] Appl. No.: 09/290,502

[22] Filed: Apr. 12, 1999

[30] Foreign Application Priority Data

May 11, 1998 [JP] Japan .................................. 10-127223

[51] Int. Cl.⁷ .......................... H03H 9/205; H03H 9/58; H03H 3/007
[52] U.S. Cl. ........................ 333/189; 333/190; 29/25.35; 310/365; 310/368
[58] Field of Search ........................... 333/189, 187–192; 310/349, 365, 367, 368; 29/25.35

[56] References Cited

U.S. PATENT DOCUMENTS

| | | | |
|---|---|---|---|
| 4,353,045 | 10/1982 | Matsui et al. | 333/190 |
| 4,431,938 | 2/1984 | Inoue | 310/366 X |
| 4,532,451 | 7/1985 | Inoue | 310/353 |
| 4,656,385 | 4/1987 | Tanaka | 310/348 |
| 5,294,862 | 3/1994 | Banno et al. | 333/189 X |
| 5,543,763 | 8/1996 | Oyama | 333/189 |
| 5,565,824 | 10/1996 | Nagano | 333/189 |
| 5,574,414 | 11/1996 | Ogawa et al. | 333/186 X |
| 5,598,133 | 1/1997 | Fuse | 333/189 |
| 5,705,880 | 1/1998 | Shimura et al. | 310/366 |
| 5,859,488 | 1/1999 | Okeshi et al. | 310/348 X |
| 5,925,974 | 7/1999 | Yamamoto et al. | 310/348 |

FOREIGN PATENT DOCUMENTS

| | | |
|---|---|---|
| 6-237141 | 8/1994 | Japan . |
| 6-164307 | 10/1994 | Japan . |
| 7-7367 | 1/1995 | Japan . |
| 7-235859 | 9/1995 | Japan . |
| 8-237073 | 9/1996 | Japan . |
| 8-242138 | 9/1996 | Japan . |

*Primary Examiner*—Robert Pascal
*Assistant Examiner*—Barbara Summons
*Attorney, Agent, or Firm*—Keating & Bennett LLP

[57] ABSTRACT

A ladder-type piezoelectric filter includes series resonators including substantially rectangular piezoelectric resonators adapted to vibrate in a longitudinal vibration mode, and parallel resonators including substantially square piezoelectric resonators adapted to vibrate in a square vibration mode. The series resonators and the parallel resonators are connected to each other via terminals so as to define a ladder circuit. A pair of grooves are respectively provided on one of the major surfaces of each series resonator at symmetrical positions with respect to the center-line which is substantially perpendicular to the longitudinal direction of the series resonator such that the pair of grooves extend in a direction that is substantially parallel to the center-line of the series resonator and divide the electrode on the one major surface to thereby adjust an electric capacitance between the pair of electrodes respectively disposed on the pair of major surfaces of the series resonator.

21 Claims, 6 Drawing Sheets

PIEZOELECTRIC LADDER FILTER WITH SERIES RESONATORS HAVING A PAIR OF GROOVES AND METHOD OF FORMING SAME

BACKGROUND OF THE INVENTION

1. Field of the Invention

The present invention relates to a ladder-type piezoelectric filter in which series resonators and parallel resonators are connected to each other so as to define a ladder circuit.

2. Description of the Related Art

In a conventional ladder-type piezoelectric filter, both series resonators and parallel resonators are defined by square piezoelectric resonators adapted to vibrate in a square vibration mode and are stacked on each other in a thickness direction of the filter. Therefore, the ladder-type piezoelectric filter, including a case and terminals, has a relatively large vertical dimension that is determined by the total thickness of the resonators. The series resonator has a thickness which is greater than that of the parallel resonator, so that the thickness of the series resonator significantly increases the total vertical dimension of the filter.

In order to solve the above problems, as disclosed in Japanese Patent Application Laid-Open (kokai) No. 6-164307, there has been proposed a ladder-type piezoelectric filter in which rectangular piezoelectric resonators which are adapted to vibrate in a longitudinal vibration mode are used as series resonators, square piezoelectric resonators adapted to vibrate in a square vibration mode are used as parallel resonators, and the series resonators are disposed in a side-by-side manner, to thereby reduce the total thickness or vertical dimension of the filter.

In a ladder-type piezoelectric filter, attenuation outside of the pass band (hereinafter referred to as the "out-of-band attenuation") per ladder stage depends on the ratio between the electric capacitance of a series resonator and that of a parallel resonator in the ladder stage. The attenuation can be adjusted to a predetermined value through change of the electric capacitance of either the series resonator or the parallel resonator. However, regardless of whether the electric capacitance of the series resonator or the parallel resonator is changed, the external dimensions (thickness, length, and width) of the resonator must be changed. Therefore, the manufacturing process becomes extremely complicated, and the shapes of terminals and a case must be changed according to the change in the dimensions of the resonator, resulting in increased cost.

SUMMARY OF THE INVENTION

To overcome the problems described above, preferred embodiments of the present invention provide a ladder-type piezoelectric filter in which series resonators are defined by elements adapted to vibrate in a longitudinal vibration mode, and parallel resonators are defined by elements adapted to vibrate in a square vibration mode, and which filter is constructed to allow simple and unlimited adjustment of the electric capacitance of the series resonators so as to achieve any desired attenuation.

A preferred embodiment of the present invention provides a ladder-type piezoelectric filter including series resonators adapted to vibrate in a longitudinal vibration mode, each of the series resonators including a piezoelectric resonator having a pair of major surfaces disposed opposite to each other and a pair of electrodes disposed on the pair of major surfaces, respectively; and parallel resonators adapted to vibrate in a square vibration mode, each of the parallel resonators including a piezoelectric resonator having a pair of major surfaces disposed opposite to each other and a pair of electrodes disposed on the pair of major surfaces, respectively; the series resonators and the parallel resonators being connected to each other so as to define a ladder circuit, wherein a pair of grooves are respectively provided on one of the major surfaces of each of the series resonators at symmetrical positions with respect to a center-line of the series resonator which is substantially perpendicular to the longitudinal direction of the series resonator such that the pair of grooves extend in a direction that is substantially parallel to the center-line of the series resonator and divide the electrode on the one major surface to thereby adjust an electric capacitance between the pair of electrodes respectively disposed on the pair of major surfaces of the series resonator.

When the pair of grooves for dividing the electrode are provided on one of the major surfaces of the series resonator as described above, the region between the pair of grooves determines the electric capacitance. Therefore, changing the relative positions of the grooves enables free and easy adjustment of the effective electrode area of the series resonator. In other words, the electric capacitance can be freely adjusted. As described above, any desired electric capacitance is achieved by changing the positions of the grooves, while the exterior shape of the series resonator remains unchanged. As a result, in the manufacturing process, only a step of forming the grooves in a manner described above is added. Further, since the exterior dimensions of the series resonator are not changed, the same terminals and case can be used as common elements for all filters to be manufactured.

In the above described ladder-type piezoelectric filter, a support member made of a conductive material is preferably provided on the electrode on one major surface of the series resonator on which the grooves are provided, or on the other major surface of the series resonator, at a substantially central position of the electrode in the longitudinal direction such that the support member extends substantially parallel to the centerline which is substantially perpendicular to the longitudinal direction of the series resonator.

In assembling the ladder-type filter, the electrode of the series resonator is disposed to contact a terminal so as to establish an electrical contact therewith. However, when the projection provided on the terminal is brought into pressure-contact with the surface of the series resonator, the series resonator is likely to be broken, or the surface of the electrode is likely to be damaged. By contrast, if the support member made of a conductive material is attached onto the surface of the electrode of the series resonator, the series resonator is electrically connected to the terminal, through the support member with ease, so that the above-described problems are avoided. The support member may be provided on one of the major surfaces, or on both the major surfaces of the series resonator.

In the case of an element adapted to vibrate in a longitudinal vibration mode, even if the grooves are provided on the element as described above, or the support member is attached to the element as described above, various characteristics of the element are not adversely affected. However, if the grooves are not arranged symmetrically with respect to the center-line which is substantially perpendicular to the longitudinal direction of the element, spurious output disadvantageously increases.

Formation of grooves in series resonators is preferably performed during a step of forming a mother substrate. That is, grooves are formed preferably by use of a dicing saw or a similar tool, on a mother substrate on which an electrode has been formed and the mother substrate is subsequently cut into unit elements. In this case, the series resonators can be produced easily with only a small increase in the number of processing steps.

Also, if support members are also formed during the step of forming the mother substrate, and thereafter the mother substrate is cut, the processing cost is not increased substantially. The support members can be formed by an example method in which a conductive paste is applied in a straight line on the mother substrate via printing or the like and is then hardened.

Other features and advantages of the present invention will become apparent from the following description of preferred embodiments of the present invention which refers to the accompanying drawings.

DETAILED DESCRIPTION OF PREFERRED EMBODIMENTS

FIGS. 1 to 4 show a ladder-type piezoelectric filter according to a preferred embodiment of the present invention.

Figure 5:
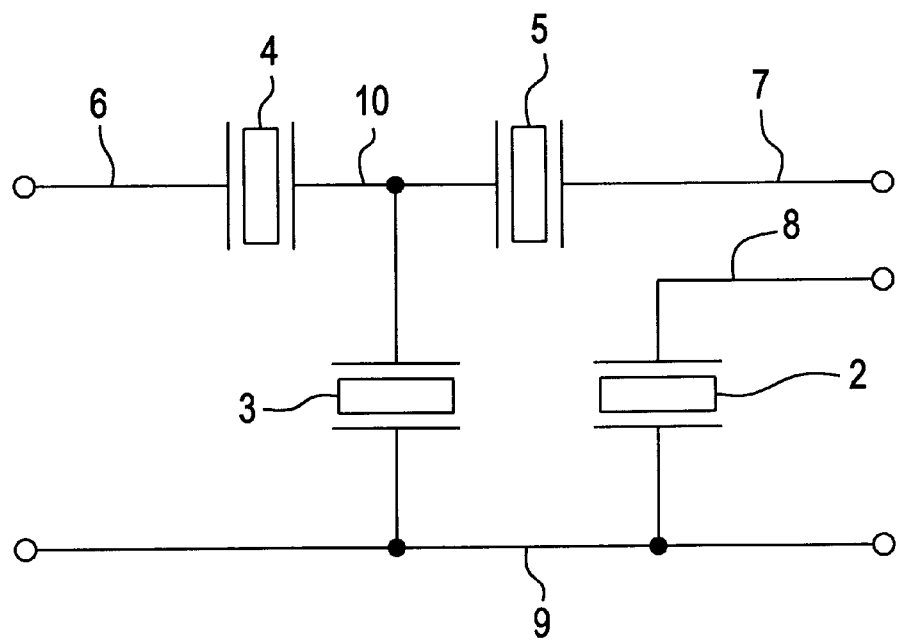
FIG. 5 is a circuit diagram of the ladder-type piezoelectric filter of FIG. 1.

The present preferred embodiment is a ladder-type filter including four elements which are arranged to constitute a circuit as shown in FIG. 5. A case 1 accommodates two parallel resonators 2 and 3, two series resonators 4 and 5, one input terminal 6, two output terminals 7 and 8, one ground terminal 9, and one independent connection terminal 10. These components are stacked on each other, pressed and held by a lid 11, and the case 1 is sealed with resin 12.

The case 1 is preferably made of a thermoplastic resin so as to have a box-like shape. The case 1 has an opening portion 1a located at one surface (an upper surface in the present preferred embodiment). A rib 1b is provided on each of the four inner surfaces of the case 1 such that the rib 1b extends in a depth direction (vertical direction). The ribs 1b position the four circumferential sides of each of the parallel resonators 2 and 3, the output terminal 8, the ground terminal 9, and the independent connection terminal 10, to thereby prevent rotation or movement of these components in the case 1. The upper end of the rib 1b is recessed from the opening portion 1a of the case 1. A vertical groove 1c is provided on either side of each of two opposite ribs 1b. The lead portions 6b–9b of the terminals 6–9 are fitted into the grooves 1c for positioning.

Each of the parallel resonators 2 and 3 is preferably defined by a piezoelectric resonator having a substantially square shape and adapted to vibrate in a square vibration mode. Electrodes 2a and 2b are respectively disposed on the entire upper and lower major surfaces of the parallel resonator 2. Likewise, electrodes 3a and 3b are respectively formed on the entire upper and lower major surfaces of the parallel resonator 3.

The series resonators 4 and 5 are preferably substantially rectangular piezoelectric resonators adapted to vibrate in a longitudinal vibration mode. Electrodes 4a and 4b (4b is not shown) are respectively disposed on the entire upper and lower major surfaces of the series resonator 4. Likewise, electrodes 5a and 5b (5b is not shown) are respectively formed on the entire upper and lower surfaces of the series resonator 5.

Figure 7:
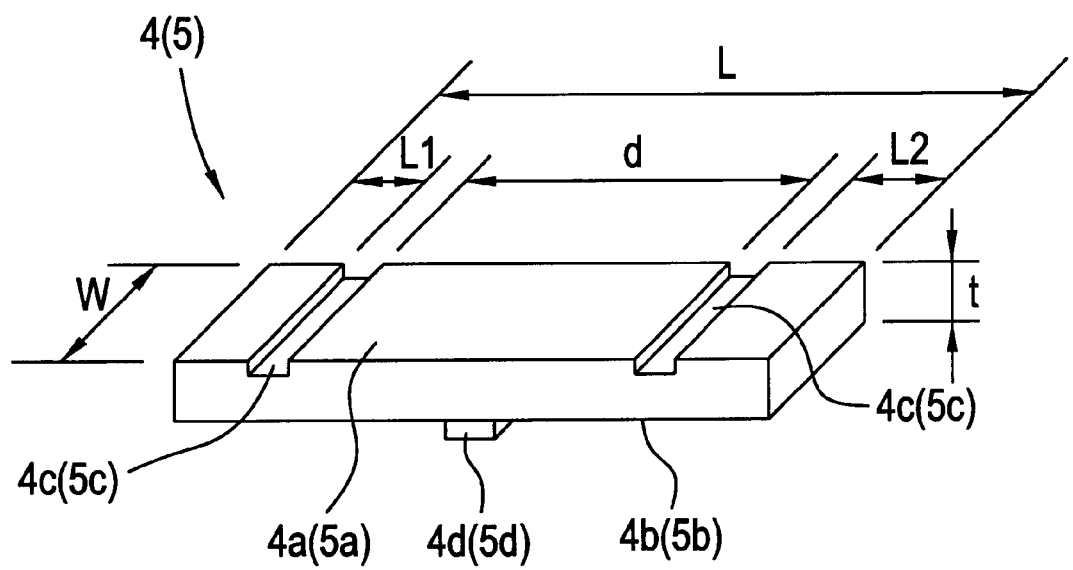
FIG. 7 is a perspective view of one example of a series resonator.

As shown in FIG. 7, in order to divide the electrode 4a, a pair of grooves 4c are respectively provided on the upper major surface of the series resonator 4 at symmetrical positions with respect to the center-line which is substantially perpendicular to the longitudinal direction of the series resonator 4 and extend in a direction along the shorter side of the series resonator 4. In order to divide the electrode 5a, a pair of grooves 5c are provided on the upper surface of the series resonator 5 at symmetrical positions with respect to a center-line CL which is substantially perpendicular to the longitudinal direction of the series resonator 5 and extend in a direction along the shorter side of the series resonator 5. A distance LI between one groove 4c (5c) and the corresponding substantially parallel edge of the series resonator 4 (5) preferably equals a distance 12 between the other groove 4c (5c) and the corresponding substantially parallel edge of the series resonator 4 (5). The groove 4c (5c) is required to have a depth such that the groove 4c (5c) divides the electrode 4a (5a) into three regions. Although in the present preferred embodiment the groove 4c (5c) is formed to extend into the piezoelectric body, the groove 4c (5c) is not required to be formed to extend into the piezoelectric body.

A support member 4d (5d) made of a conductive material is formed on the lower major surface of the electrode 4b (5b) at a substantially central position of the electrode in the longitudinal direction such that the support member 4d (5d) extends substantially parallel to the shorter side of the series resonator 4 (5). Since the series resonators 4 and 5 are arranged side by side at the bottom of the case 1, the overall thickness of the filter is greatly decreased as compared with the case of a conventional ladder-type filter in which resonators which are adapted to vibrate in a square vibration mode are stacked on each other.

The input terminal 6 has an electrode plate portion 6a, and a lead portion 6b bent so as to extend substantially perpendicular to the electrode plate portion 6a. The electrode plate portion 6a is disposed on the bottom surface of the case 1. The lead portion 6b is fitted into the corresponding groove 1c of the case 1, and projects from the opening portion 1a of the case 1. The support member 4d of the series resonator 4 contacts the upper surface of the electrode plate portion 6a so as to establish electrical contact therewith.

The output terminal 7 preferably has an identical shape as the input terminal 6. The output terminal 7 has an electrode plate portion 7a, and a lead portion 7b which is bent so as to extend substantially perpendicular to the electrode plate portion 7a. The electrode plate portion 7a is disposed on the bottom surface of the case 1. The lead portion 7b is fitted into the corresponding groove 1c of the case 1, and projects from the opening portion 1a of the case 1. The support member 5d of the series resonator 5 contacts the upper surface of the electrode plate portion 7a so as to establish electrical contact therewith.

The output terminal 8 is preferably made of a conductive spring plate. The output terminal 8 has a substantially square electrode plate portion 8a that is substantially equal in area to the parallel resonators 2 and 3, and a lead portion 8b bent so as to extend substantially perpendicular to the electrode plate portion 8a. From the approximate central portion of the electrode plate portion 8a, a contacting portion 8c projects downwardly so as to contact the upper-surface electrode 2a of one parallel resonator 2. Also, the electrode plate portion 8a is downwardly curved in the form of a partial sphere. Therefore, the output terminal 8 has elasticity in its thickness direction. The lead portion 8b is fitted into the corresponding groove 1c of the case 1, and projects from the opening portion 1a of the case 1.

Although the output terminals 7 and 8 are provided separately, their respective lead portions 7b and 8b are connected to each other in an external circuit (for example, on a printed board).

The ground terminal 9 has an electrode plate portion 9a and a lead portion 9b. The electrode plate portion 9a has a folded structure and is substantially equal in surface area to the parallel resonators 2 and 3. The lead portion 9b is bent so as to extend substantially perpendicular to the electrode plate portion 9a. The lead portion 9b is fitted into the corresponding groove 1c of the case 1, and projects from the opening portion 1a of the case 1. From the approximate central portion of the upper surface of the electrode plate portion 9a, a contacting portion 9c projects upwardly so as to contact with the lower-surface electrode 2b of the parallel resonator 2 (see FIG. 3). From the approximate central portion of the lower surface of the electrode plate portion 9a, a contacting portion 9d projects downwardly so as to come in contact with the upper-surface electrode 3a of the parallel resonator 3 (see FIG. 3).

The independent connection terminal 10 is a separate terminal having no lead portion, and is a square plate which is substantially equal in surface area to the parallel resonators 2 and 3. From the approximate central portion of the lower surface of the independent connection terminal 10, a contact portion 10a projects upwardly so as to contact the lower-surface electrode 3b of the parallel resonator 3. Ridge-shaped contact portions 10b and 10c project downwardly from the surface of the independent connection terminal 10 such that the contact portions 10b, 10c extend along a line which passes through the contact portion 10a and substantially parallel to one side of the independent connection terminal 10. The contact portion 10b (10c) contacts the central portion of the upper-surface electrode 4a (5a) of the series resonator 4 (5). That is, the contact portion 10b (10c) contacts the central portion of the electrode which is isolated from the side portions by two grooves 4c (5c).

Figure 1:
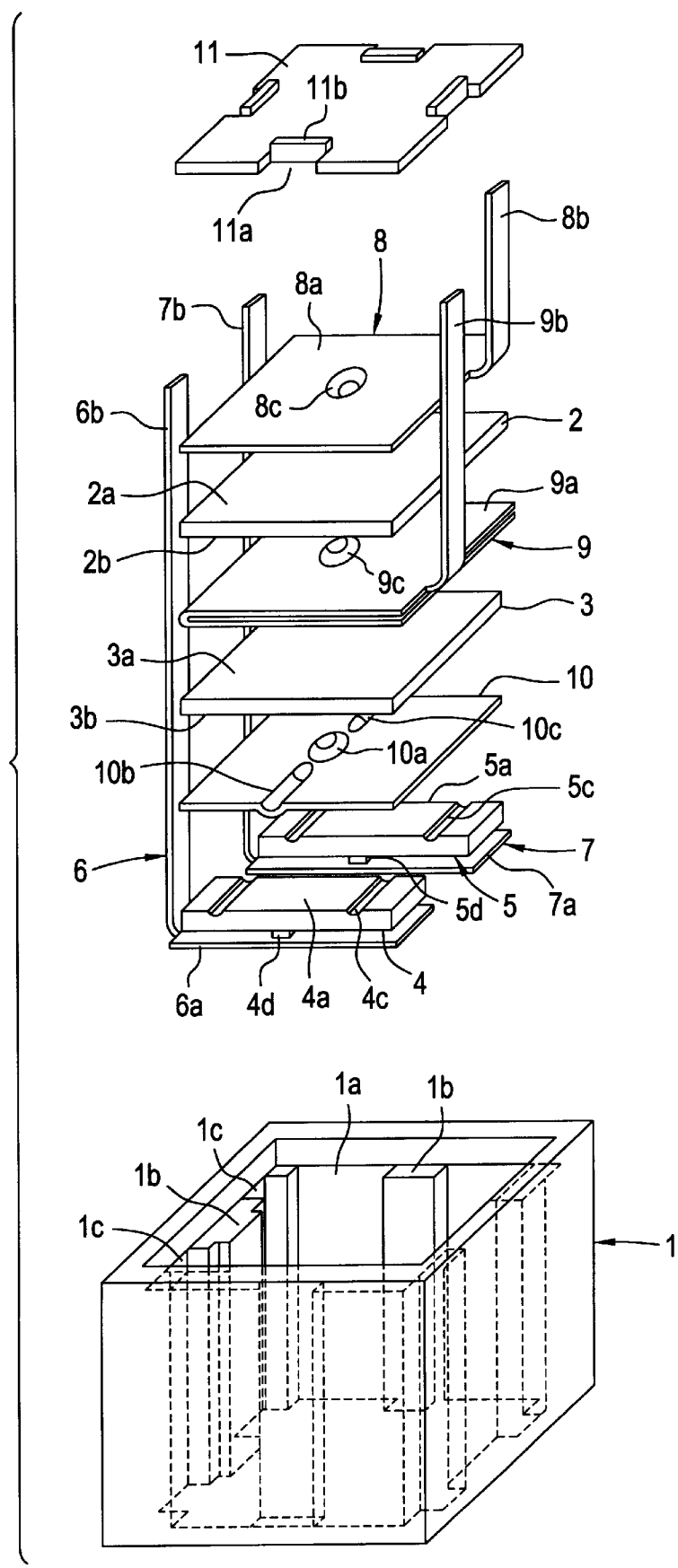
FIG. 1 is an exploded perspective view of a ladder-type piezoelectric filter according to one preferred embodiment of the present invention.
Figure 2:
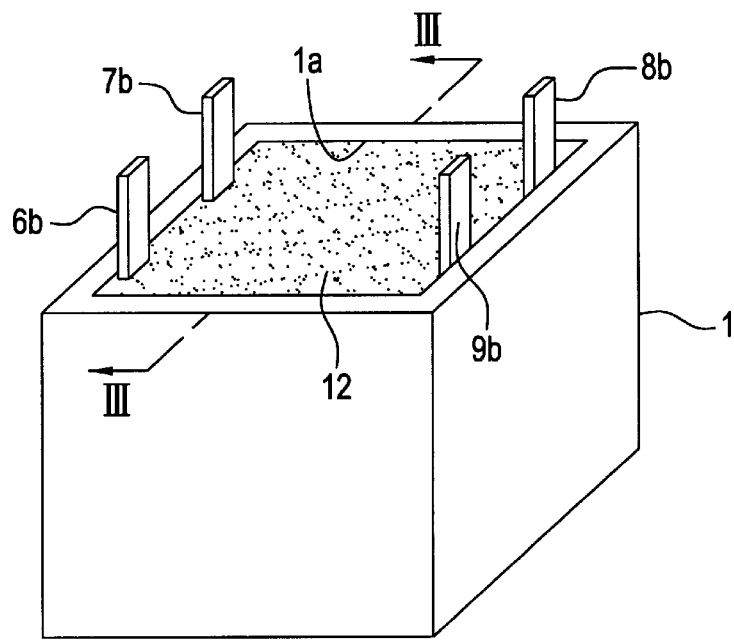
FIG. 2 is a perspective view of the ladder-type piezoelectric filter of FIG. 1 in an assembled state.
Figure 3:
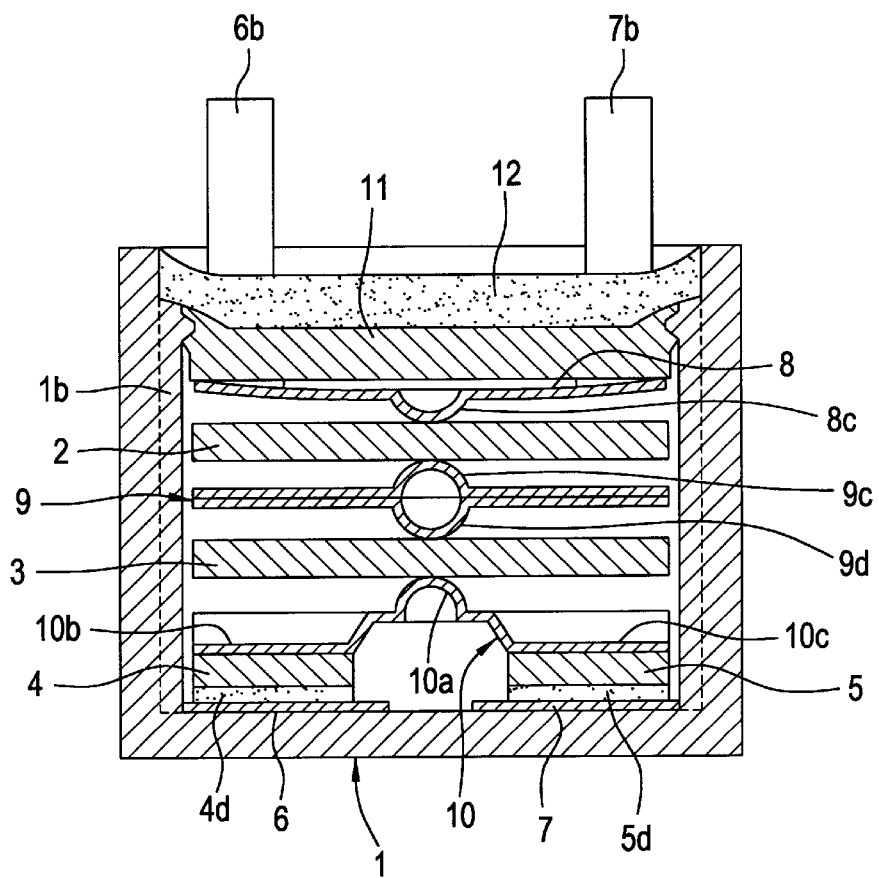
FIG. 3 is a sectional view taken along line III—III in FIG. 2.
Figure 4:
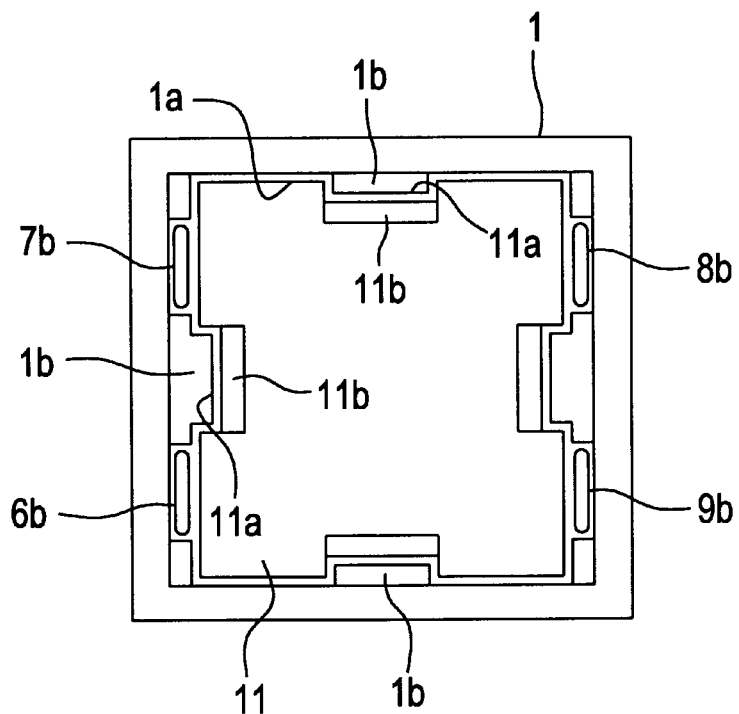
FIG. 4 is a bottom view of the ladder-type piezoelectric filter of FIG. 1 before resin is added.

The generally square lid 11 is preferably made of the thermoplastic resin used to form the case 1. As shown in FIG. 4, the lid 11 has a size such that the lid 11 can be fitted into the opening portion 1a of the case 11 especially, into a deeper side of the opening portion 1a where the ribs 1b are provided. For this deep fitting, a recess 11a for engaging the corresponding rib 1b is preferably provided in each of the four sides of the lid 11. A projection 11b used for welding, projects upwardly from the inner edge of each of the recesses 11a.

Next, a method of assembling the ladder-type filter having the above-mentioned structure will be described by reference to FIGS. 6A to 6D.

Figure 6A:
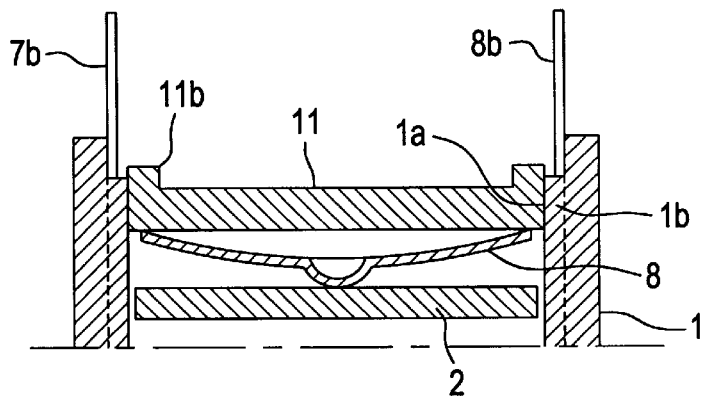
FIGS. 6A, 6B, 6C and 6D are explanatory views illustrating steps of assembling the ladder-type piezoelectric filter of FIG. 1.

First, as shown in FIG. 6A, components such as the parallel resonators 2 and 3, the series resonators 4 and 5, the input terminal 6, the output terminals 7 and 8, the ground terminal 9, and the independent connection terminal 10 are stacked within the case 1. Subsequently, the lid 11 is fitted into the opening portion 1a of the case 1. During this stage, the output terminal 8 is slightly compressed, and the lid 11 is in a slightly lifted sate.

Figure 6B:
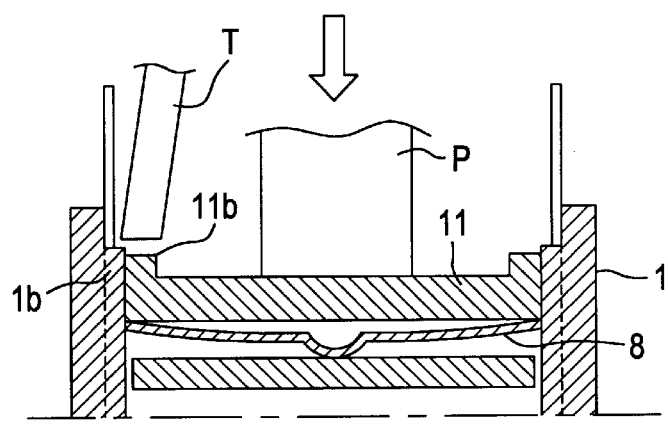

Next, as shown in FIG. 6B, the lid 11 is pressed down by use of a pusher P so that the output terminal 8 is bent or deformed, to thereby cause the components to come together under pressure. In this state, the projections 11b of the lid 11 and the ribs 1b of the case 1 are welded together by use of an iron T or similar tool. In this case, as an alternative to conventional welding, ultrasonic welding may be used.

Figure 6C:
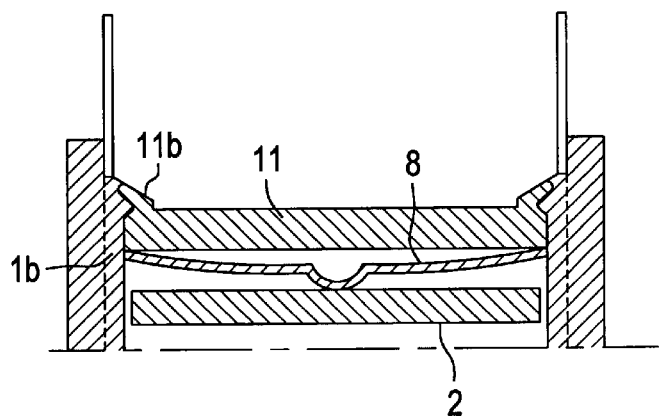

As shown in FIG. 6C, upon completion of welding, the projections 11b of the lid 11 and the ribs 1b of the case 1 are fixed together, so that detachment of the lid 11 is prevented.

Figure 6D:
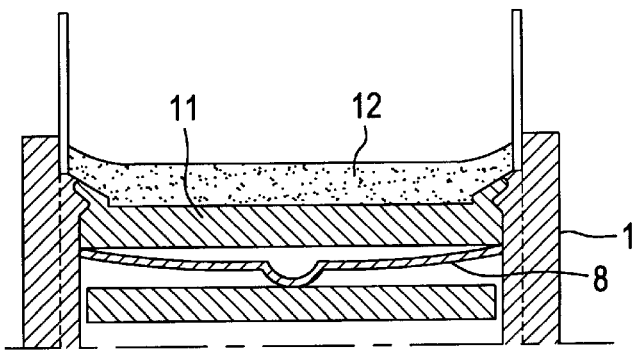

Subsequently, as shown in FIG. 6D, the liquid resin 12 is charged into the concave space formed by the lid 11 and the opening portion 1a of the case 1 and is cured, to thereby seal the interior of the case 1.

Generally, in the case of a conventional ladder-type filter, if there are variations in thickness of the components, a predetermined contact pressure cannot be produced among components, resulting in lowered reliability. In contrast, in the present preferred embodiment, during the step of fitting the lid 11 into the opening portion 1a of the case 1, the lid 11 can be freely moved in the depth direction of the case 1 (i.e., in the vertical direction) while its recesses 11 a are guided by the ribs 1b, and the welding position can be freely changed. Therefore, the lid 11 is pressed into the case 1 by use of the pusher P until a predetermined contact pressure is attained, at which point the lid 11 is welded to the case 1. Through this operation, the contact pressure is always made constant, so that a high-reliability ladder-type filter is achieved.

In a conventional ladder-type filter, in order to change the out-of-band attenuation, the shapes of the series resonator and the parallel resonator must be changed, resulting in great difficulty. In contrast, in the above-described preferred embodiment, the attenuation can be easily changed through adjustment of the electrical capacitance of series resonators 4 and 5. The reasons are described below.

As shown in FIG. 7, the electrical capacitance of each of the series resonators 4 and 5 varies depending on the area of its oppositely disposed electrodes. In this preferred embodiment, since the lower-surface electrodes 4b (5b) is a whole-surface electrode, the area of the electrode cannot be changed. In contrast, the upper-surface electrodes 4a (5a) is divided into three regions by the two laterally extending grooves 4c (5c). Therefore, the opposite regions of the electrode portion do not contribute to the electrical characteristics, and only the central region of the electrode portion determines the electrical capacitance. The area of the electrode is represented by d×W, wherein d is the length of the central region of the electrode portion, and W is the width of the central region. Since W is fixed, the area of the electrode, i.e., the electrical capacitance, can be freely adjusted through change of the length, which can, in turn, be adjusted through change of the positions of the grooves 4c (5c). That is, the electrical capacitance (out-of-band attenuation) can be freely adjusted by simply changing the positions of grooves 4c (5c), and without changing the external shape of the series resonator 4 (5).

Figure 8:
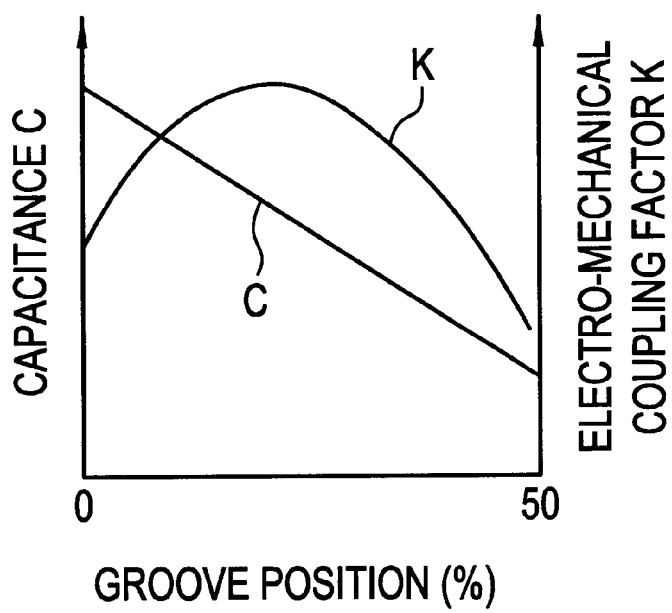
FIG. 8 is a characteristic chart showing the relationships between groove position, electric capacitance, and electromechanical coupling factor.

FIG. 8 shows relationships between positions of the grooves, the electrical capacitance C of the series resonator 4 (5), and electromechanical coupling factor K.

As shown in FIG. 8, if the two grooves 4c (5c) are provided at the opposite ends (L1/L×100=0(%)), the electrical capacitance C reaches a maximum value. As the grooves approach the central portion (50%), the electrical capacitance C decreases linearly. On the other hand, the electromechanical coupling factor K attains the maximum value when the grooves are provided at intermediate positions between the opposite ends and the central portion (at the position about 12.5% of the entire length as measured from either longitudinal end surface). Also, the electromechanical coupling factor K decreases as the grooves approach the central portion (50%). As described above, it is understood that the values of C and K are adjusted to optimal values by simply changing the positions of the grooves 4c (5c).

Figure 9:
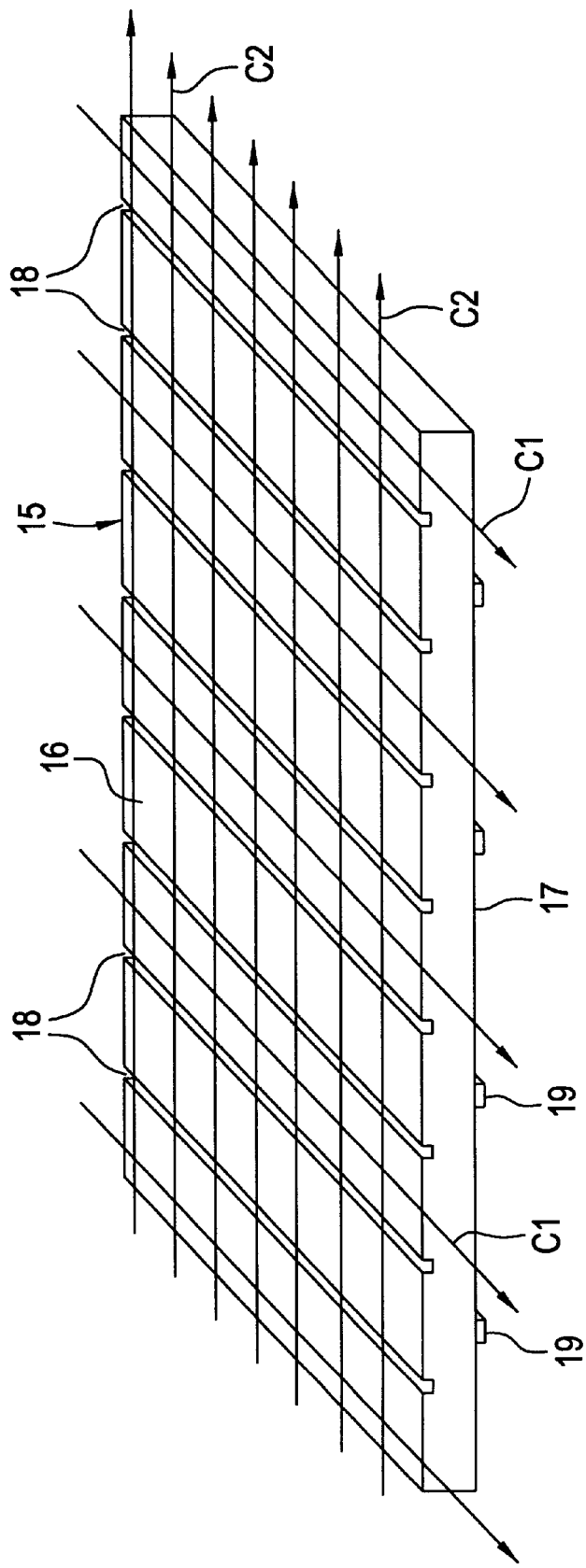
FIG. 9 is a perspective view of an exemplary mother substrate which is used to manufacture the series resonators.

The series resonators 4 and 5 are made from, for example, a mother substrate 15 as shown in FIG. 9. The mother substrate 15 is previously subjected to polarization so that a longitudinal vibration mode can be excited. Electrodes 16 are arranged to extend along on the entire upper surface of the mother substrate 15. Electrodes 17 are arranged to extend along the entire lower surface of the mother substrate 15. Shallow grooves 18 are formed in the mother substrate 15 by use of a dicing saw or similar tool such that they extend substantially parallel to one another in a certain direction. Support members 19 are mounted on the lower surface of the mother substrate 15 via a conductive paste such that the support members 19 extend in a straight line substantially parallel to the grooves 18. The support members 19 are formed preferably via screen printing or other suitable method. After formation of the support members 19, the mother substrate 15 is cut along cut lines C1 and C2 into unit elements, so that the series resonators 4 and 5 are easily produced.

As described above, even if steps of forming grooves and support members are required to be additionally performed, the time required to perform these steps can be minimized because the grooves and support members are formed during formation of the mother substrate 15. Therefore, there is only a very slight increase in manufacturing time and cost.

In the above-described preferred embodiment, the support member 4d (5d) is provided on the lower major surface of the series resonator 4 (5), and the upper major surface of the series resonator 4 (5) contacts the projection 10b (10c) of the connection terminal 10. However, alternatively, a support member may be provided on each of the upper and lower surfaces of a series resonator. In this case, the projections 10b and 10c of the connection terminal 10 are not required.

Alternatively, the following structure may be used: the support members of the series resonators 4 and 5 are omitted; a laterally extending projection having a shape that is substantially identical to that of the projections 10b and 10c of the connection terminal 10 is provided on the upper surface of each of the input terminal 6 and the output terminal 7; and the projection is arranged to contact the central portion of the lower-surface electrode of each of the series resonators 4 and 5.

In the present preferred embodiment, the output terminal 8 is resilient so as to achieve reliable conductive contact between the components provided in the case 1. However, a spring plate or cushioning material may be provided separately from the terminal.

As is apparent from the above description, the present invention provides a ladder-type piezoelectric filter including series resonators adapted to vibrate in a longitudinal vibration mode, and parallel resonators adapted to vibrate in a square vibration mode. In this ladder-type piezoelectric filter, two electrode-division-grooves are provided on one of the major surfaces of the series resonator at symmetrical positions with respect to the center-line which is substantially perpendicular to the longitudinal direction of the series resonator such that the pair of grooves extend in a direction substantially parallel to the center-line of the series resonator, so as to adjust electrical capacitance between the electrodes of the pair of major surfaces. As a result, the attenuation of the ladder-type filter can be set to a desired value easily and accurately.

In addition, any desired electric capacitance is achieved by simply changing the positions of the grooves, while the exterior shape of the series resonator remains unchanged. Therefore, in the manufacturing process, only a step of forming the grooves is additionally performed. Further, since the exterior dimensions of the series resonator remain unchanged, the same terminals and case can be used in common among various types of ladder-type filters, so that various types of ladder-type filters are produced at low cost.

While the invention has been particularly shown and described with reference to preferred embodiments thereof, it will be understood by those skilled in the art that the forgoing and other changes in form and details may be made therein without departing from the spirit of the invention.

What is claimed is:

1. A ladder-type piezoelectric filter comprising:

series resonators adapted to vibrate in a longitudinal vibration mode, each of the series resonators comprising a piezoelectric resonator having a pair of major surfaces disposed opposite to each other and a pair of electrodes disposed on the pair of major surfaces, respectively; and parallel resonators adapted to vibrate in a square vibration mode, each of the parallel resonators comprising a piezoelectric resonator having a pair of major surfaces opposite to each other and a pair of electrodes disposed on the pair of major surfaces, respectively; the series resonators and the parallel resonators being connected to each other so as to define a ladder circuit, wherein a pair of grooves are respectively provided on one of the major surfaces of each of the series resonators at symmetrical positions with respect to a center-line which is substantially perpendicular to the longitudinal direction of the respective series resonator such that the pair of grooves extend in a direction substantially parallel to the center-line of the respective series resonator and divide the electrode on the one major surface to thereby adjust an electric capacitance between the pair of electrodes respectively disposed on the pair of major surfaces of the respective series resonator.

2. The ladder-type piezoelectric filter according to claim 1, wherein each of the series resonators has a substantially rectangular shape and has a length that is greater than a width.

3. The ladder-type piezoelectric filter according to claim 1, wherein each of the parallel resonators has a substantially square shape and has a length that is substantially equal to a width.

4. The ladder-type piezoelectric filter according to claim 1, wherein the series resonators each include a piezoelectric substrate and the electrodes are disposed on the piezoelectric substrate, wherein the grooves extend through said electrodes.

5. The ladder-type piezoelectric filter according to claim 4, wherein the grooves extend into said piezoelectric substrate.

6. The ladder-type piezoelectric filter according to claim 4, wherein the grooves extend substantially parallel to opposite edges of said piezoelectric substrate.

7. The ladder-type piezoelectric filter according to claim 4, wherein the grooves extend along an entire width of said piezoelectric substrate.

8. The ladder-type piezoelectric filter according to claim 4, wherein the grooves are located at opposite end regions of said piezoelectric substrate and are spaced from opposite edges of said piezoelectric substrate by substantially the same distance.

9. The ladder-type piezoelectric filter according to claim 1, wherein the grooves in a first of the series resonators are aligned with the grooves in a second of the series resonators.

10. The ladder-type piezoelectric filter according to claim 1, wherein a support member made of a conductive material is provided on the electrode on one major surface of the series resonator on which the grooves are provided, or on the other major surface of the series resonator, at a substantially central position of the electrode in the longitudinal direction such that the support member extends substantially parallel to the center-line which is substantially perpendicular to a longitudinal direction of the series resonator.

11. A method of forming a ladder-type piezoelectric filter comprising the steps of:

forming a mother substrate used to produce a plurality of series resonators;

forming a first electrode on a first major surface of the mother substrate;

forming a second electrode on a second major surface of the mother substrate;

forming grooves in the first major surface so that the grooves extend substantially parallel to each other;

cutting the mother substrate along lines which are substantially parallel and substantially perpendicular to the grooves to form filter unit elements;

providing a case;

forming parallel resonators adapted to vibrate in a square vibration mode, each of the parallel resonators comprising a piezoelectric resonator having a pair of major surfaces opposite to each other and a pair of electrodes disposed on the pair of major surfaces, respectively;

stacking the series resonator and the parallel resonators in the case;

connecting the series resonators and the parallel resonators to each other so as to define a ladder circuit;

wherein each of the series resonators includes a pair of the grooves respectively provided on the first major surface of each of the series resonators at symmetrical positions with respect to a center-line which is substantially perpendicular to the longitudinal direction of the respective series resonator such that the pair of grooves extend in a direction substantially parallel to the center-line of the respective series resonator and divide the electrode on the one major surface to thereby adjust an electric capacitance between the pair of electrodes respectively disposed on the pair of major surfaces of the respective series resonator.

12. The method according to claim 11, further comprising the steps of forming support members on the second major surface of the mother substrate before the step of cutting the mother substrate.

13. The method according to claim 12, wherein the support members extend substantially parallel to the grooves.

14. The method according to claim 11, wherein the grooves in a first of the series resonators are aligned with the grooves in a second of the series resonators.

15. The method according to claim 11, wherein each of the series resonators has a substantially rectangular shape and has a length that is greater than a width.

16. The method according to claim 11, wherein each of the parallel resonators has a substantially square shape and has a length that is substantially equal to a width.

17. The method according to claim 11, wherein the series resonators each include a piezoelectric substrate and the electrodes are disposed on the piezoelectric substrate, wherein the grooves extend through said electrodes.

18. The method according to claim 17, wherein the grooves extend into said piezoelectric substrate.

19. The method according to claim 17, wherein the grooves extend substantially parallel to opposite edges of said piezoelectric substrate.

20. The method according to claim 17, wherein the grooves extend along an entire width of said piezoelectric substrate.

21. The method according to claim 17, wherein the grooves are located at opposite end regions of said piezoelectric substrate and are spaced from opposite edges of said piezoelectric substrate by substantially the same distance.

* * * * *